(12) United States Patent
Song et al.

(10) Patent No.: US 10,186,679 B2
(45) Date of Patent: Jan. 22, 2019

(54) ORGANIC LIGHT-EMITTING APPARATUS INCLUDING ELECTRON TRANSPORT LAYER AND METHOD OF MANUFACTURING THE SAME

(71) Applicant: Samsung Display Co., Ltd., Yongin-si (KR)

(72) Inventors: Wonjun Song, Yongin-si (KR); Jaebok Kim, Yongin-si (KR); Jungjin Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/638,964

(22) Filed: Jun. 30, 2017

(65) Prior Publication Data

US 2018/0006261 A1   Jan. 4, 2018

(30) Foreign Application Priority Data

Jun. 30, 2016   (KR) ..................... 10-2016-0082972

(51) Int. Cl.
*H01L 51/52*   (2006.01)
*H01L 51/50*   (2006.01)

(52) U.S. Cl.
CPC ...... *H01L 51/5203* (2013.01); *H01L 51/5056* (2013.01); *H01L 51/5072* (2013.01); *H01L 51/5088* (2013.01)

(58) Field of Classification Search
CPC ............ H01L 51/5203; H01L 51/5056; H01L 51/5072; H01L 51/5088

USPC ......................................................... 257/211
See application file for complete search history.

(56) References Cited

U.S. PATENT DOCUMENTS

| | | | |
|---|---|---|---|
| 2010/0283385 A1* | 11/2010 | Maeda | ................ H01L 51/5265 313/504 |
| 2012/0111483 A1 | 5/2012 | Nakagawa et al. | |
| 2013/0171335 A1 | 7/2013 | Lee et al. | |
| 2016/0104854 A1* | 4/2016 | Jeon | ...................... H01L 51/508 257/40 |

FOREIGN PATENT DOCUMENTS

| | | |
|---|---|---|
| KR | 10-2011-0136950 | 12/2011 |
| KR | 10-2012-0047809 | 5/2012 |
| KR | 10-2013-0076403 | 7/2013 |
| KR | 10-2014-0038600 | 3/2014 |

* cited by examiner

*Primary Examiner* — Fernando L Toledo
*Assistant Examiner* — Adam S Bowen
(74) *Attorney, Agent, or Firm* — H.C. Park & Associates, PLC

(57) ABSTRACT

An organic light-emitting apparatus and a method of manufacturing the same. The method includes depositing a mixed layer and a buffer layer as an electron transport layer on the emission layer by making a single round-trip of the source unit that includes the first through third ejectors in a scanning direction of the substrate, wherein the mixed layer includes a mixture of the first and second semiconductor materials and the buffer layer includes a single layer including the third semiconductor material.

14 Claims, 4 Drawing Sheets

Location of Mixed Layer

ORGANIC LIGHT-EMITTING APPARATUS INCLUDING ELECTRON TRANSPORT LAYER AND METHOD OF MANUFACTURING THE SAME

CROSS-REFERENCE TO RELATED APPLICATION

This application claims priority from and the benefit of Korean Patent Application No. 10-2016-0082972, filed on Jun. 30, 2016, which is hereby incorporated by reference for all purposes as if fully set forth herein.

BACKGROUND

Field

Exemplary embodiments relate to an organic light-emitting apparatus having an electron transport layer disposed between an emission layer and a counter electrode, and a method of manufacturing the organic light-emitting apparatuses in which the electron transport layer is efficiently deposited.

Discussion of the Background

An organic light-emitting apparatus realizes a color image by re-combining holes and electrons injected respectively from an anode and a cathode. Pixels of the organic light-emitting apparatus have a stack structure in which an emission layer is disposed between a pixel electrode, which is an anode, and a counter electrode, which is a cathode.

Each of the pixels may be, for example, a sub-pixel of one of a red pixel, a green pixel, and a blue pixel, and a desired color may be realized by a combination of the three color sub-pixels. That is, each pixel has a structure in which an emission layer that emits one of red, green and blue color is disposed between two electrodes, and a color of a unit pixel is expressed by an appropriate combination of the three colors.

A hole transport layer (HTL) and a hole injection layer (HIL) may be disposed between the emission layer and the pixel electrode, and an electron transport layer (ETL) and an electron injection layer (EIL) may be disposed between the emission layer and the counter electrode.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting apparatus having an electron transport layer disposed between an emission layer and a counter electrode, and a method of manufacturing the organic light-emitting apparatus in which the electron transport layer is efficiently deposited.

Additional aspects will be set forth in part in the description which follows and, in part, will be apparent from the description, or may be learned by practice of the inventive concept.

An exemplary embodiment discloses an organic light-emitting apparatus including: a pixel electrode connected to a thin film transistor (TFT), a counter electrode corresponding to the pixel electrode, an emission layer disposed between the pixel electrode and the counter electrode, and an electron transport layer disposed between the emission layer and the counter electrode. The electron transport layer includes a mixed layer and a buffer layer disposed between the emission layer and the mixed layer, the mixed layer including a plurality of semiconductor materials that are mixed and the a buffer layer including a single semiconductor material.

The mixed layer may include first and second semiconductor materials that are different from each other.

The content of the first semiconductor material may be the lowest at both edges of the mixed layer, may gradually increase towards the center, and may be the highest at the center of the mixed layer. The content of the second semiconductor material may be the highest at both edges of the mixed layer, may gradually reduce towards the center, and may be the lowest at the center of the mixed layer.

The buffer layer may include a third semiconductor material, the third semiconductor material being different from the first and second semiconductor materials.

The organic light-emitting apparatus may further include an electron injection layer between the electron transport layer and the counter electrode.

The organic light-emitting apparatus may further include a hole injection layer and a hole transport layer between the pixel electrode and the emission layer.

The TFT may include: an active layer, a gate electrode facing the active layer with an insulating layer therebetween, a source electrode connected to an edge of the active layer, and a drain electrode that connects the other edge of the active layer to the pixel electrode.

An exemplary embodiment also discloses a method of manufacturing an organic light-emitting apparatus, including: preparing a substrate on which an emission layer is formed; preparing a source unit in which first through third semiconductor materials that are materials for depositing an electron transport layer on the emission layer are respectively accommodated in a first ejector, a second ejector, and a third ejector; and depositing a mixed layer and a buffer layer on the emission layer by making a single round-trip of the source unit that includes the first through third ejectors in a scanning direction of the substrate. The mixed layer includes a mixture of the first and second semiconductor materials, and the buffer layer includes a single layer including the third semiconductor material.

The third ejector is located in an upper stream in the forward direction of the single round-trip of the source unit, as compared to the first and second ejectors.

The third semiconductor material may be ejected from the third ejector in the forward direction movement of the single round-trip of the source unit, and the ejection of the third semiconductor material may be blocked in the backward direction movement of the source unit.

An ejection outlet of the third ejector may be blocked by a shutter when the source unit is moved in the backward direction.

The first and second ejectors may continuously eject the first and second semiconductor materials during both the forward and backward directions of the single round-trip of the source unit.

The second ejector may be disposed in an upper stream in the forward direction of the single round-trip of the source unit, as compared to the first ejector.

The content of the first semiconductor material may be the lowest in both edges of the mixed layer, may gradually increase towards the center of the mixed layer, and may be the highest in the center of the mixed layer. The content of the second semiconductor material may be the highest in both edges of the mixed layer, may gradually reduce towards the center of the mixed layer, and may be the lowest in the center of the mixed layer.

The first, second, and third semiconductor materials are different from each other.

The buffer layer may be formed on the emission layer, and the mixed layer may be formed on the buffer layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
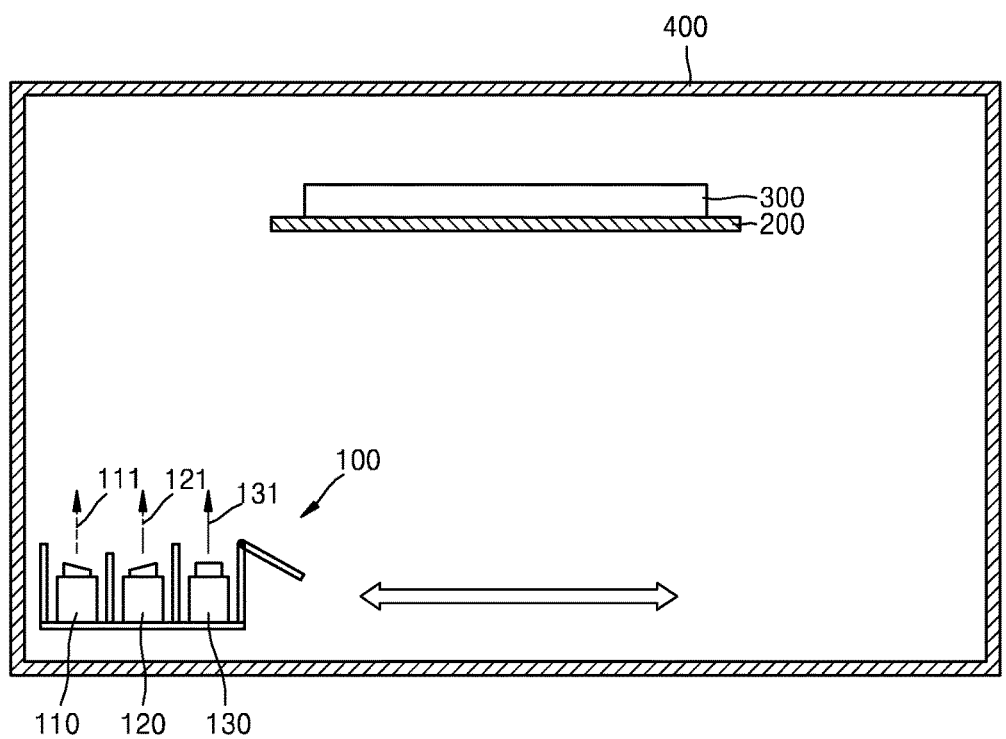
FIG. 1 is a schematic view of a structure of a deposition apparatus for manufacturing an organic light-emitting apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic view of a structure of a deposition apparatus for manufacturing an organic light-emitting apparatus according to an exemplary embodiment.

As depicted in FIG. 1, the deposition apparatus according to an exemplary embodiment includes a mask 200 for forming a desired pattern on a substrate 300 of an organic light-emitting apparatus, wherein the substrate 300 is an object to be deposited and a source unit 100 that ejects deposition gas towards the substrate 300 by moving in a chamber 400.

Accordingly, when the source unit 100 ejects deposition gas in the chamber 400, corresponding deposition gas is deposited on the substrate 300 through an opening formed in the mask 200, and thus, a thin film having a predetermined pattern is formed on the substrate 300.

The source unit 100 described herein is for forming an electron transport layer 324 (refer to FIG. 2) on the substrate 300 of an organic light-emitting apparatus. The source unit 100 may include a first ejector 110 that ejects a first semiconductor material 111 as deposition gas, a second ejector 120 that that ejects a second semiconductor material 121 as deposition gas, and a third ejector 130 that ejects a third semiconductor material 131 as deposition gas. The first through third semiconductor materials 111, 121, and 131 are different from each other. Of the first through third semiconductor materials 111, 121, and 131, the third semiconductor material 131 is a material for forming a buffer layer 324a, which is a single material layer of the electron transport layer 324, and the first and second semiconductor materials 111 and 121 are materials for forming a mixed layer 324b of the electron transport layer 324. A shutter 132 is provided in the source unit 100 which blocks an ejector outlet of the third ejector 130, if necessary.

Figure 2:
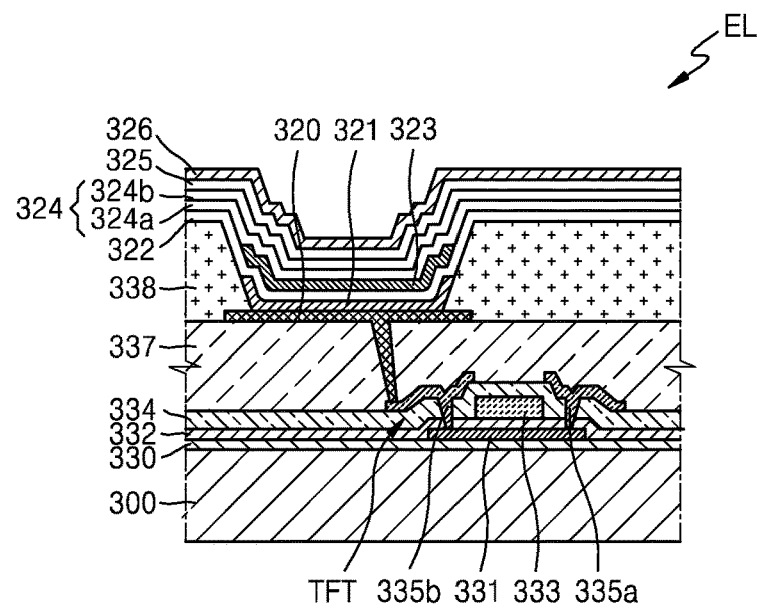
FIG. 2 is a cross-sectional view of a structure of a pixel of an organic light-emitting apparatus manufactured by the deposition apparatus of FIG. 1, according to an exemplary embodiment.

A detailed structure of the organic light-emitting apparatus including the electron transport layer 324 described above will be described with reference to FIG. 2. FIG. 2 is a cross-sectional view of a single sub-pixel of the organic light-emitting apparatus, and a plurality of the sub-pixels may be repeatedly arranged in a display region on the substrate 300. An actual thickness of the substrate 300 of the organic light-emitting apparatus is considerably greater than those of thin film layers thereon. However, in the drawings, for convenience of explanation, the thickness of the substrate 300 and that of the sub-pixels are drawn as being similar to each other.

Referring to FIG. 2, a buffer layer 330 is formed on the substrate 300, and a thin film transistor (TFT) is formed on the buffer layer 330.

The TFT includes an active layer 331, a gate insulating film 332 covering the active layer 331, and a gate electrode 333 on the gate insulating film 332.

Also, an interlayer insulating layer 334 is formed on the gate electrode 333, and a source electrode 335a and a drain electrode 335b are formed on the interlayer insulating layer 334.

The source electrode 335a and the drain electrode 335b respectively contact source and drain regions of the active layer 331 through contact holes formed in the gate insulating film 332 and the interlayer insulating layer 334.

A pixel electrode 320 of an organic light-emitting diode EL is connected to the drain electrode 335b. The pixel electrode 320 is formed on a planarization film 337, and a pixel-defining layer 338 is formed on the planarization film 337. An emission layer 323 and an intermediate layer including the emission layer 323 are formed on the planarization film 337, and a counter electrode 326 is formed on the intermediate layer.

The auxiliary layer includes a hole injection layer 321 and a hole transport layer 322 disposed between the pixel electrode 320 and the emission layer 323, and the electron transport layer 324 and an electron injection layer 325 disposed between the emission layer 323 and the counter electrode 326.

The hole transport layer 322, the electron transport layer 324, and the electron injection layer 325 are common layers that are formed over the whole pixel region, like the counter electrode 326. Accordingly, the corresponding layers (the hole transport layer 322, the electron transport layer 324, and the electron injection layer 325?) are formed by using the open-type mask 200 with which deposition is performed on a whole display region on the substrate 300 in any pattern.

Here, the electron transport layer 324 is described in detail. The electron transport layer 324 includes two layers, that is, the buffer layer 324a that directly contacts the emission layer 323 and a mixed layer 324b disposed on the buffer layer 324a.

As described above, the buffer layer 324a is a single material layer formed by depositing the third semiconductor material 131 ejected from the third ejector 130. The mixed layer 324b is a composite material layer formed by mixing the first semiconductor material 111 ejected from the first ejector 110 with the second semiconductor material 121 ejected from the second ejector 120.

The electron transport layer 324 includes two layers, that is, the buffer layer 324a including a single material and the mixed layer 324b including composite materials instead of a single layer is to improve both a function of smoothly supplying electrons to the emission layer 323; and a function of blocking holes moving towards the counter electrode 326.

That is, in the structure of the organic light-emitting diode EL described above, light is emitted from the emission layer 323 by holes moving to the emission layer 323 from the pixel electrode 320 through the hole injection layer 321 and the hole transport layer 322 and electrons moving to the emission layer 323 from the counter electrode 326 through the electron injection layer 325 and the electron transport layer 324. However, if holes that moved to the emission layer 323 still move to the counter electrode 326, the movement of electrons is interrupted, and thus, light emission efficiency may be reduced.

However, the mixed layer 324b formed by mixing the first and second semiconductor materials 111 and 121 together has an energy level barrier that is higher than that of the electron transport layer 324 formed as a single layer. Thus, the mixed layer 324b functions as a blocking barrier that prevents holes from penetrating the counter electrode 326 through the emission layer 323.

However, if the electron transport layer 324 only includes the mixed layer 324b, the movement of electrons from the counter electrode 326 to the emission layer 323 may be difficult. That is, due to a high energy level barrier between the mixed layer 324b and the emission layer 323, holes may not as easily move as the electrons. However, as in the current exemplary embodiment, when the buffer layer 324a, which is a single material layer, is formed between the emission layer 323 and the mixed layer 324b, the buffer layer 324a reduces the energy level barrier, and thus, electrons may easily move to the emission layer 323.

Accordingly, both the functions of blocking holes moving to the counter electrode 326 and smooth movement of electrons to the emission layer 323 may be realized.

The electron transport layer 324 having the advantages described above may be manufactured by only a single round-trip of the source unit 100.

Figure 3:
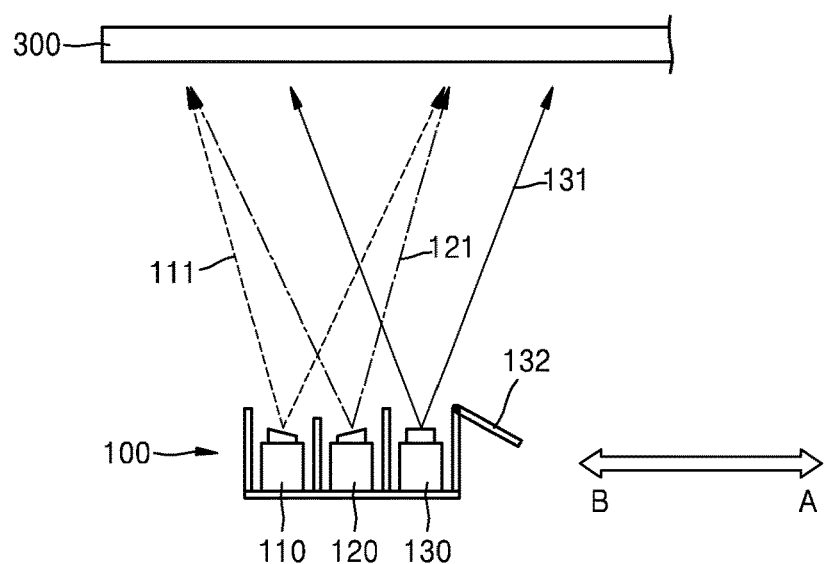
FIG. 3 is a cross-sectional view illustrating a situation that a source unit of the deposition apparatus of FIG. 1 ejects semiconductor materials for forming an electron transport layer onto a substrate of an organic light-emitting apparatus, according to an exemplary embodiment.
Figure 4A:
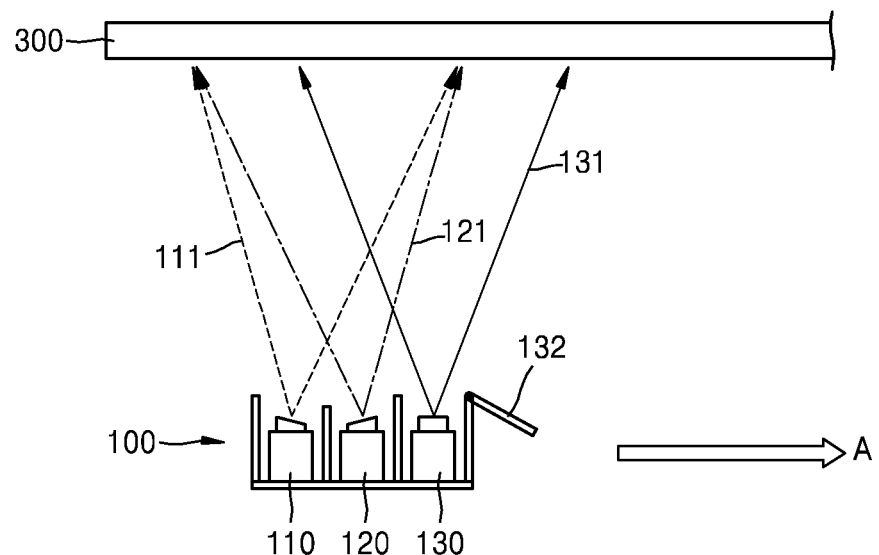
FIG. 4A and FIG. 4B are cross-sectional views illustrating the forming of the electron transport layer of FIG. 3 in forward and backward operations representing a single round-trip of a source unit, according to an exemplary embodiment.
Figure 4B:
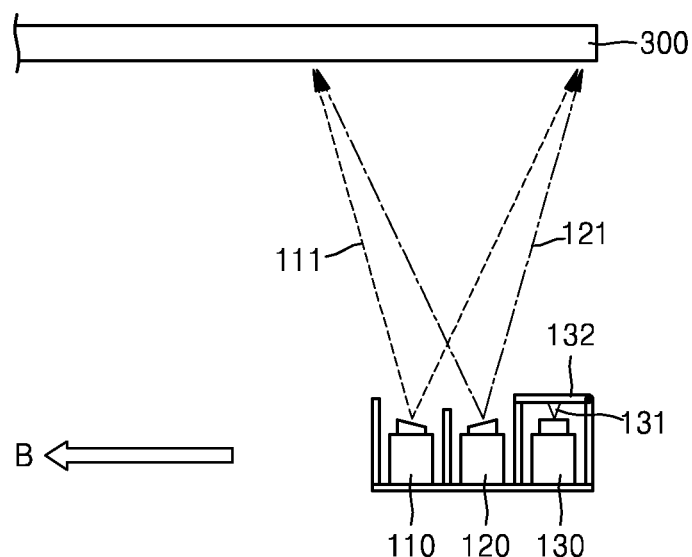

Hereinafter, a method of manufacturing the electron transport layer 324 will be described with reference to FIGS. 3, 4A, and 4B. When the electron transport layer 324 is deposited, the open-type mask 200 is placed between the source unit 100 and the substrate 300. However, the open-type mask 200 is omitted for convenience of explanation. Also, when the electron transport layer 324 is deposited, the emission layer 323 has already been formed above the substrate 300 in an exposed region of the pixel-defining film 338. As shown in FIGS. 3, 4A, and 4B, the emission layer 323 is formed on a lower surface of the substrate 300, that is, the surface of the substrate 300 facing the source unit 100.

When the source unit 100 is operated in this state, as depicted in FIG. 3, the first through third semiconductor materials 111, 121, and 131 are ejected respectively from the first through third ejectors 110, 120, and 130, and ejected deposition gases are deposited on the substrate 300, on which the emission layer 323 is formed. However, the source unit 100 does not remain stationary, but instead makes a single round-trip, that is, forward in a direction indicated by the arrow A and backward as indicated by the arrow B. The buffer layer 324a and the mixed layer 324b are formed during the single round-trip of the source unit 100. The third ejector 130 is disposed on a front side of the source unit 100, compared to the first ejector 110 and the second ejector 120, in the forward direction (direction A). Accordingly, when the source unit 100 starts a deposition operation by moving in the forward direction, the third semiconductor material 131 ejected from the third ejector 130 is initially deposited on the substrate 300, and afterwards, deposition of the first and second semiconductor materials 111 and 121 respectively ejected from the first ejector 110 and the second ejector 120 is continued on the third semiconductor material 130.

Ejection directions of the first and second semiconductor materials 111 and 121 respectively ejected from the first ejector 110 and the second ejector 120 are set so that regions of the substrate 300 on which the first and second semiconductor materials 111 and 121 substantially overlap with each other. Accordingly, based on the forward direction (direction A), compared to the first ejector 110, the second ejector 120 is located in an upper stream. However, the second semiconductor material 121 is not deposited ahead, but the first and second semiconductor materials 111 and 121 are deposited together by mixing with each other.

When the source unit 100 moves in the backward direction, as indicated by the arrow B, an ejection hole of the third ejector 130 is blocked by the shutter 132. That is, the buffer layer 324a is formed only when the source unit 100 moves in the forward direction, and when the source unit 100 moves in the backward direction, only the mixed layer 324b is formed by the ejection of the first ejector 110 and the second ejector 120. That is, the first ejector 110 and the second ejector 120 continuously operate during the single round-trip of the source unit 100, and the third ejector 130 only operates in the forward direction during the single round-trip of the source unit 100. Of course, the third ejector 130 is not turned-off, but the deposition gas is prevented from moving towards the substrate 300 by blocking an ejection outlet of the third ejector 130 with the shutter 132.

A process of forming the electron transport layer 324 through the single round-trip of the source unit 100 may be summarized as follows.

First, as depicted in FIG. 4A, the substrate 300, on which the emission layer 323 is fixed, is placed in the chamber 400 (refer to FIG. 1), and afterwards, while operating the source unit 100, the source unit 100 is moved in the forward direction as indicated by the arrow A. Then, the buffer layer 324a and the mixed layer 324b of the electron transport layer 324 are formed by ejecting the deposition gases, that is, the first through third semiconductor materials 111, 121, and 131 respectively from the first ejector 110, the second ejector 120, and the third ejector 130. As described above, the deposition gas, that is, the third semiconductor material 131 ejected from the third ejector 130 located upstream in the forward direction (direction A) is firstly deposited on the substrate 300 to form the buffer layer 324a, and afterwards, the deposition gases, that is, the first and second semiconductor materials 111 and 121 respectively ejected from the first ejector 110 and the second ejector 120, are deposited on the buffer layer 324a, thus forming the mixed layer 324b.

Next, as depicted in FIG. 4B, the source unit 100 moves in the backward direction as indicated by the arrow B. at this time, the ejection outlet of the third ejector 130 is covered by the shutter 132. Thus, while the source unit 100 is moved in the backward direction, only the mixed layer 324b is formed by the first and second semiconductor materials 111 and 121 respectively ejected from the first ejector 110 and the second ejector 120.

In this manner, the electron transport layer 324 including the buffer layer 324a as a single material layer and the mixed layer 324b as a composite material layer may be simply realized by only a single round-trip of the source unit 100.

Figure 5:
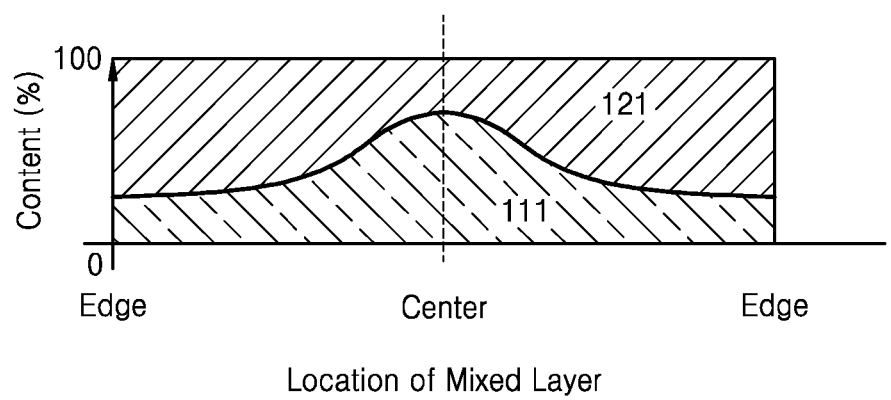
FIG. 5 is a graph showing a content profile of a mixed layer of the electron transport layer formed by the single round-trip of the source unit of FIGS. 4A and 4B.

Since the mixed layer 324b is formed by the single round-trip of the source unit 100, a content profile of the first and second semiconductor materials 111 and 121 formed on the substrate 300 may be a shape as depicted in FIG. 5. That is, although the deposition regions of the first ejector 110 and the second ejector 120 substantially overlap with each other, the concentration distribution of the first semiconductor material 111 is biased on the left side of the drawing, and the concentration of the second semiconductor material 121 is biased on the right side of the drawing. Also, the first ejector 110 enters a region of the substrate 300 later than the second ejector 120 when the source unit 100 moves in the forward direction, and leaves the region of the substrate 300 earlier than the second ejector 120 when the source unit 100 moves in the backward direction, and thus, the content of the first semiconductor material 111 is relatively low at both edges of the mixed layer 324b. Instead, the content of the first semiconductor material 111 gradually increases from the edges towards the central region, and is the highest at the center of the mixed layer 324b. The content of the first semiconductor material 111 in the mixed layer 324b is relative content, and thus, in the case of the second semiconductor material 121, the content of the second semiconductor material 121 is the highest at the edges and is the lowest at the center of mixed layer 324b. This type of content profile is formed due to the single round-trip deposition of the source unit 100. In other words, this type of content profile may be an indicator that the mixed layer 324b is deposited by the single round-trip of the source unit 100.

Accordingly, in the method of manufacturing the electron transport layer 324 according to an exemplary embodiment, the electron transport layer 324 having both an improved hole blocking function and an improved hole transport function may be formed by a simple process.

The first through third semiconductor materials 111, 121, and 131 may be selected from various well-known materials that may constitute the electron transport layer 324, and are not specifically limited. Also, in the mixed layer 324b that is formed by moving the source unit 100 in the forward direction, the third semiconductor material 131 may be partly mixed in the mixed layer 324b. However, since the energy level barrier of the mixed layer 324b is increased by forming the mixed layer 324b as a composite material layer, the functions thereof may not be a problem.

Therefore, when the organic light-emitting apparatus described above and a method of manufacturing the same are used, an electron transport layer may be deposited by a single round-trip of a source unit. Therefore, material loss may be minimized. Also, the electron transport layer includes a stack layer of a buffer layer and a mixed layer, in which the mixed layer provides a hole blocking function and the buffer layer provides a smooth electron transporting function, thereby ensuring a stable performance of the product.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting apparatus comprising:
a pixel electrode connected to a thin film transistor;
a counter electrode corresponding to the pixel electrode;
an emission layer disposed between the pixel electrode and the counter electrode; and
an electron transport layer disposed between the emission layer and the counter electrode,
wherein:
the electron transport layer comprises a mixed layer and a buffer layer disposed between the emission layer and the mixed layer;
the mixed layer comprises first and second semiconductor materials that are mixed and are different from each other;
the buffer layer comprises a single semiconductor material;
the content of the first semiconductor material is the lowest at both edges of the mixed layer, gradually increases towards the center, and is the highest at the center of the mixed layer, and
the content of the second semiconductor material is the highest at both edges of the mixed layer, gradually reduces towards the center, and is the lowest at the center of the mixed layer.

2. The organic light-emitting apparatus of claim 1, wherein the buffer layer comprises a third semiconductor material different from the first and second semiconductor materials.

3. The organic light-emitting apparatus of claim 1, further comprising an electron injection layer disposed between the electron transport layer and the counter electrode.

4. The organic light-emitting apparatus of claim 1, further comprising a hole injection layer and a hole transport layer disposed between the pixel electrode and the emission layer.

5. The organic light-emitting apparatus of claim 1, wherein the thin film transistor comprises:
an active layer;
a gate electrode facing the active layer with an insulating layer therebetween;
a source electrode connected to an edge of the active layer, and
a drain electrode that connects the other edge of the active layer to the pixel electrode.

6. A method of manufacturing an organic light-emitting apparatus, the method comprising:
preparing a substrate on which an emission layer is formed;
preparing a source unit in which first through third semiconductor materials that are materials for depositing an electron transport layer on the emission layer are respectively accommodated in a first ejector, a second ejector, and a third ejector; and
depositing a mixed layer and a buffer layer on the emission layer by making a single round-trip of the source unit in a scanning direction of the substrate,
wherein:
the mixed layer comprises a mixture of the first and second semiconductor materials; and the buffer layer comprises a single layer comprising the third semiconductor material.

7. The method of claim 6, wherein the third ejector is located in an upper stream in the forward direction of the single round-trip of the source unit, as compared to the first ejector and the second ejector.

8. The method of claim 6, wherein the third semiconductor material is ejected from the third ejector in the forward direction movement of the single round-trip of the source unit, and the ejection of the third semiconductor material is blocked in the backward direction movement of the source unit.

9. The method of claim 8, wherein an ejection outlet of the third ejector is blocked by a shutter when the source unit is moved in the backward direction.

10. The method of claim 6, wherein the first ejector and the second ejector continuously eject the first and second semiconductor materials during both the forward and backward directions of the single round-trip of the source unit.

11. The method of claim 6, wherein the second ejector is disposed in an upper stream in the forward direction of the single round-trip of the source unit, as compared to the first ejector.

12. The method of claim 11, wherein:
the content of the first semiconductor material is the lowest in both edges of the mixed layer, gradually increases towards the center of the mixed layer, and is the highest in the center of the mixed layer; and
the content of the second semiconductor material is the highest in both edges of the mixed layer, gradually reduces towards the center of the mixed layer, and is the lowest in the center of the mixed layer.

13. The method of claim 6, wherein the first, second, and third semiconductor materials are different from each other.

14. The method of claim 6, wherein the buffer layer is formed on the emission layer, and the mixed layer is formed on the buffer layer.

* * * * *